(12) United States Patent
Horng

(10) Patent No.: US 6,386,785 B1
(45) Date of Patent: May 14, 2002

(54) ENGAGING POST FOR A HEAT-DISSIPATING DEVICE

(75) Inventor: Alex Horng, Kaohsiung (TW)

(73) Assignee: Sunonwealth Electric Machine Industry Co., Ltd., Kaohsiung (TW)

(*) Notice: Subject to any disclaimer, the term of this patent is extended or adjusted under 35 U.S.C. 154(b) by 22 days.

(21) Appl. No.: 09/599,455

(22) Filed: Jun. 22, 2000

(51) Int. Cl.⁷ .................................................. B25G 3/00
(52) U.S. Cl. ...................................................... 403/14
(58) Field of Search .......................... 24/453, 297, 628, 24/459; 411/508, 509, 913

(56) References Cited

U.S. PATENT DOCUMENTS

| | | | | |
|---|---|---|---|---|
| 3,093,027 A | * | 6/1963 | Rapata | |
| 3,476,008 A | * | 11/1969 | Pearson et al. | |
| 4,987,639 A | * | 1/1991 | Baiuley et al. | |
| 5,384,940 A | * | 1/1995 | Soule et al. | 24/453 |
| 5,730,210 A | * | 3/1998 | Kou | |
| 6,061,240 A | * | 5/2000 | Butterbaugh | 411/508 |
| 6,112,378 A | * | 9/2000 | Lee | |

* cited by examiner

Primary Examiner—Lynne H. Browne
Assistant Examiner—Tomlyne A. Malcolm
(74) Attorney, Agent, or Firm—Bacon & Thomas, PLLC

(57) ABSTRACT

A positioning device is provided for securing an object to a fixing plate having a plurality of positioning holes. The positioning device includes a cover plate having a side with a plurality of engaging posts extended from the side. Each engaging post includes a conic distal end with an enlarged annular shoulder, each engaging post including a transverse slot that extends over the annular shoulder. The annular shoulder is compressed and passed through an associated positioning hole and then expands into its original shape so as to be retained to an underside of the fixing plate in an area surrounding the associated positioning hole, thereby securing the object between the cover plate and the fixing plate.

3 Claims, 4 Drawing Sheets

ENGAGING POST FOR A HEAT-DISSIPATING DEVICE

BACKGROUND OF THE INVENTION

1. Field of the Invention

The present invention relates to an engaging post for a heat-dissipating device, and more particularly to an engaging post that may secure the heat-dissipating fan to an object in a convenient manner with a better securing effect.

2. Description of the Related Art

U.S. patent application Ser. No. 09/559,078 filed on Apr. 27, 2000 discloses positioning devices for a heat-generating element (e.g., a central processing unit) and a heat-dissipating device. The heat-dissipating device includes a base made of metal of excellent thermal conductivity and a cover plate to which a fan is mounted. The base has an underside in intimate contact with the central processing unit. The base includes a plurality of peripheral fins that define a central compartment for receiving the fan. The cover plate includes a plurality of posts each passing through a positioning hole defined in the circuit board and/or a positioning hole defined in the base, thereby securing the cover plate and the base to the circuit board and providing the required positioning effect. Each post includes a snap fastener on a lower distal end thereof, the snap fastener having a longitudinal slit to provide the snap fastener with required resiliency for compression and expansion in a radial direction when the snap fastener is passed through a corresponding positioning hole. Nevertheless, the snap fastener tends to have a resiliency fatigue or break by the root portion thereof due to repeated detachment and assembly.

SUMMARY OF THE INVENTION

It is an object of the present invention to provide an engaging post for a heat-dissipating device, wherein the engaging post can be assembled and detached in a convenient manner. In addition, the engaging post can be used for a long time while providing a reliable securing effect.

The present invention provides a positioning device for a heat-dissipating device. The positioning device includes a fixing plate to which a heat-generating element (e.g., a processing unit) is mounted. The positioning device further includes a cover plate having a plurality of engaging post extended therefrom. Each engaging post is extended through an associated positioning hole in the fixing plate. Each engaging post includes a conic engaging end with an enlarged annular shoulder that is passed through the associated positioning hole when attaching the cover plate to the fixing plate. The annular shoulder is compressed when it is passing through the associated positioning hole and then returns to its original shape after passing through the associated positioning hole so as to be retained to an underside of the fixing plate. In a preferred embodiment of the invention, the annular shoulder includes a longitudinal slot to allow deformation when it is passing through the associated positioning hole.

Other objects, specific advantages, and novel features of the invention will become more apparent from the following detailed description and preferable embodiments when taken in conjunction with the accompanying drawings.

DETAILED DESCRIPTION OF THE PREFERRED EMBODIMENTS

Preferred embodiments in accordance with the present invention will now be described with reference to the accompanying drawings.

Figure 1:
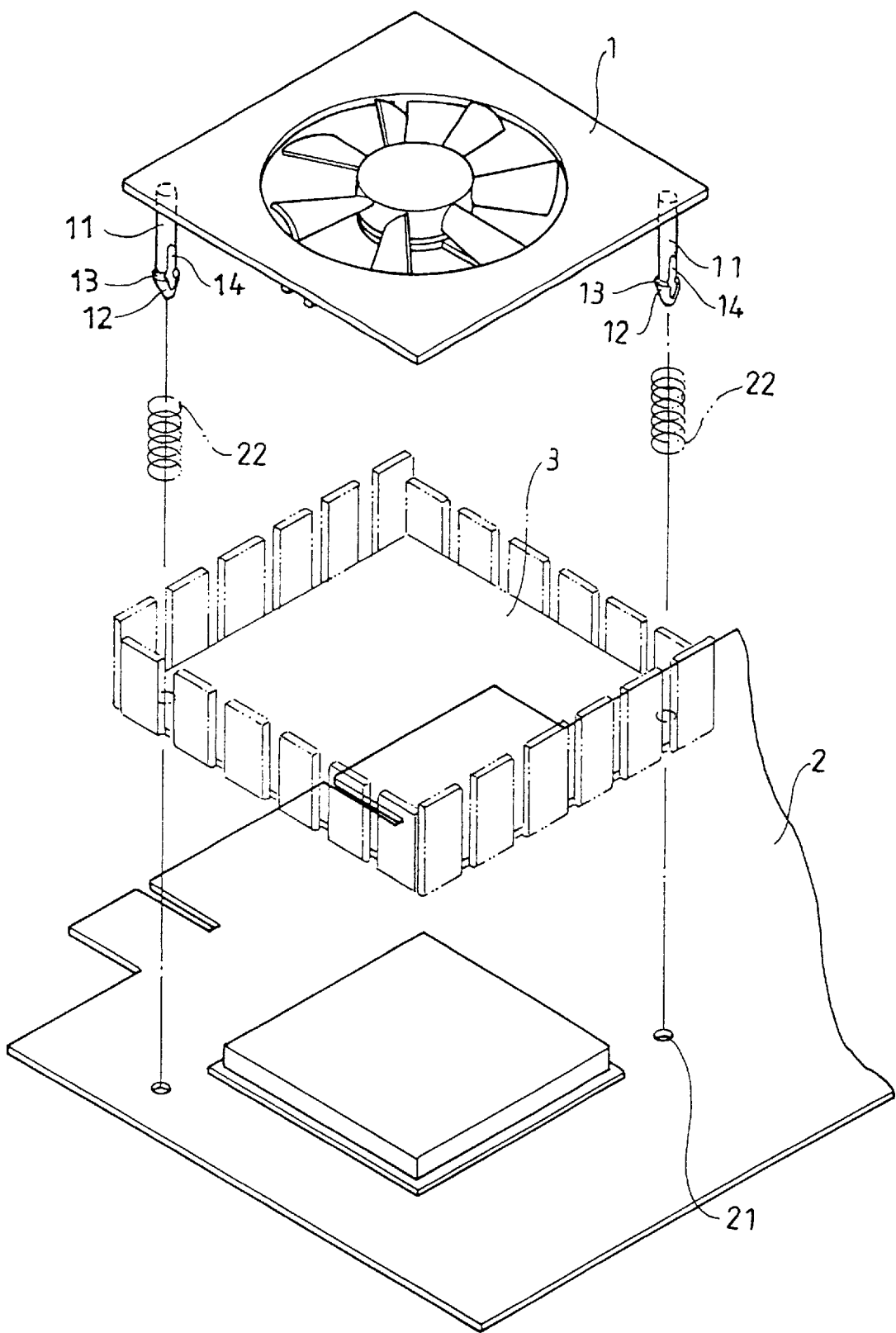
FIG. 1 is an exploded perspective view of a first embodiment of a positioning device for a heat-dissipating device in accordance with the present invention.
Figure 2:
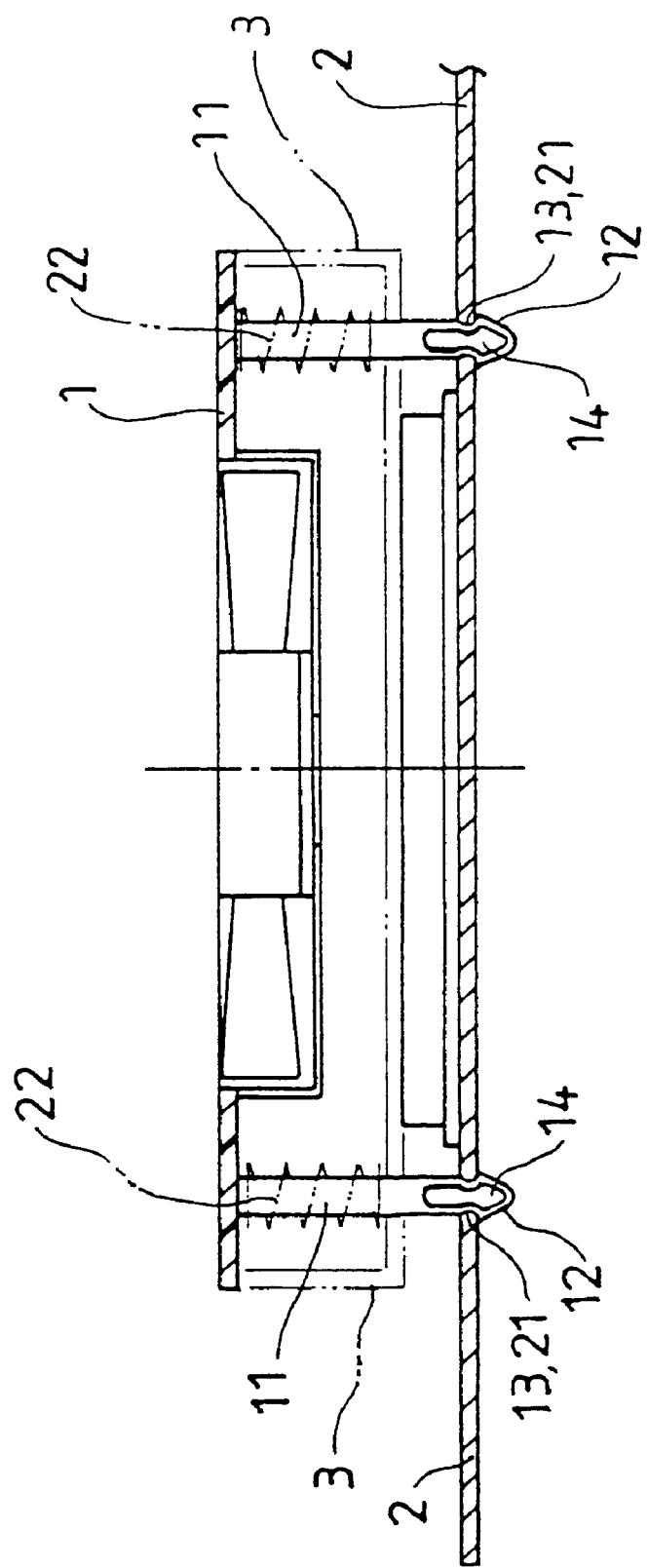
FIG. 2 is a sectional view of the positioning device in FIG. 1.

Referring to FIGS. 1 and 2, a first embodiment of a positioning device for a heat-dissipating device in accordance with the present invention generally includes a cover plate 1 and a fixing plate 2. The cover plate 1 may be a face plate or bottom plate of a heat-dissipating fan. The cover plate 1 includes a plurality of engaging posts 11 extended downward from an underside thereof. Each engaging post 11 includes a distal engaging portion 12 that may be conic and have an enlarged annular shoulder 13. Each engaging post 11 includes a transverse slot 14 that extends through the annular shoulder 13 of the distal engaging portion 12. Provision of the transverse slot 14 provides the annular shoulder 13 with resiliency to allow the annular shoulder 13 to be compressed and then expands to its original shape.

The fixing plate 2 may be a conventional circuit board or any kind of objects to be fixed. The fixing plate 2 includes a plurality of positioning holes 21 that has an inner diameter smaller than an outer diameter of uncompressed annular shoulder 13.

FIG. 2 is a sectional view illustrating assembly of the positioning device in accordance with the present invention. The engaging portion 12 of each engaging post 11 is compressed such that the annular shoulder 13 may pass through the associated positioning hole 21 in the fixing plate 2. The annular shoulder 13 is retained to an underside of the fixing plate 2. Thus, the cover plate 1 is secured to the fixing plate 2 by the engaging posts 11, thereby securely holding an object 3 (e.g., a heat-dissipating member) between the cover plate 1 and the fixing plate 2. The object 3 has a corresponding number of positioning holes (not labeled) through which the engaging posts 11 extend. In addition, an elastic element 22 may be sleeved around each engaging post 11 and attached between the underside of the cover plate 1 and the annular shoulder 13, best shown in FIG. 2. The elastic element 22 pushes the cover plate 1 upward to reliably retain the annular shoulder 13 to the underside (in an area surrounding the positioning hole 21) of the fixing plate 2.

Figure 3:
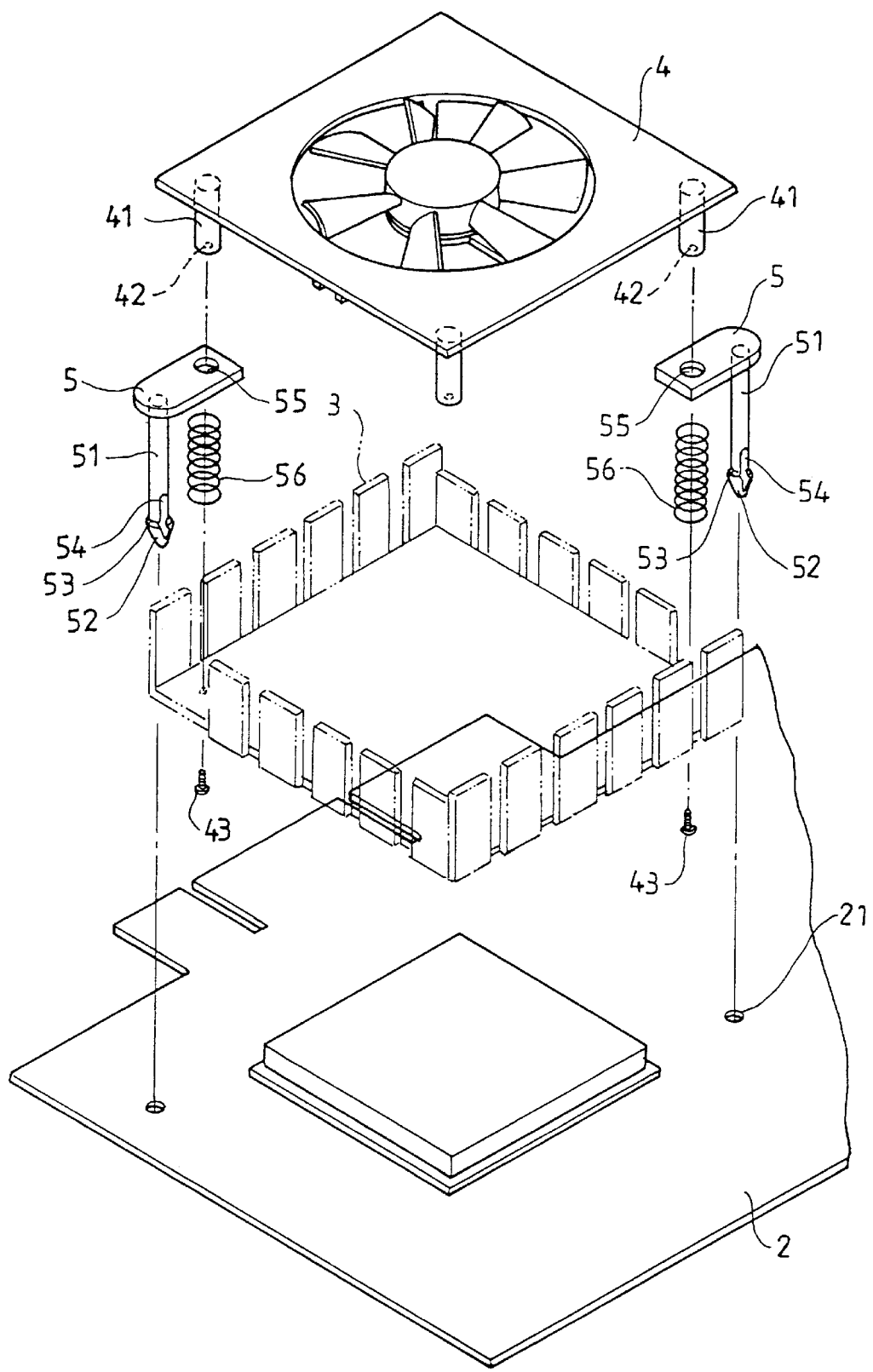
FIG. 3 is an exploded perspective view of a second embodiment of the positioning device in accordance with the present invention.

FIG. 3 illustrates a second embodiment of the positioning device in accordance with the present invention. The positioning device includes a cover plate 4, a fixing plate 2, and a plurality of assembly plates 5. The cover plate 4 may be a face plate or bottom plate for a heat-dissipating fan. The cover plate 4 includes a plurality of pegs 41 extended downward from an underside thereof. Each peg 41 includes an engaging hole 42 in a distal end thereof for engagement with a fastener 43 (such as a screw), thereby engaging with an object to be fixed.

Each assembly plate 5 has an appropriate length and includes a hole 55 in an end thereof. An engaging post 51 extends outward from a side (the underside in FIG. 3) of the assembly plate 5 in other end. The engaging post 51 includes an engaging portion 52 that may be conic and have an enlarged annular shoulder 53. Each engaging post 51 includes a transverse slot 54 that extends through the annular shoulder 53 of the distal engaging portion 52. Provision of the transverse slot 54 provides the annular shoulder 53 with resiliency to allow the annular shoulder 53 to be compressed and then expands. The annular shoulder 53 of the engaging post 51 is retained to an underside of the fixing plate 2 after assembly, which will be described later. In addition, an elastic element 56 may be sleeved around each engaging post 51 or each peg 41 of the cover plate 41.

The fixing plate 2 may be a conventional circuit board or any kind of objects for fixture. The fixing plate 2 includes a plurality of positioning holes 21 that has an inner diameter smaller than an outer diameter of uncompressed annular shoulder 13.

Figure 4:
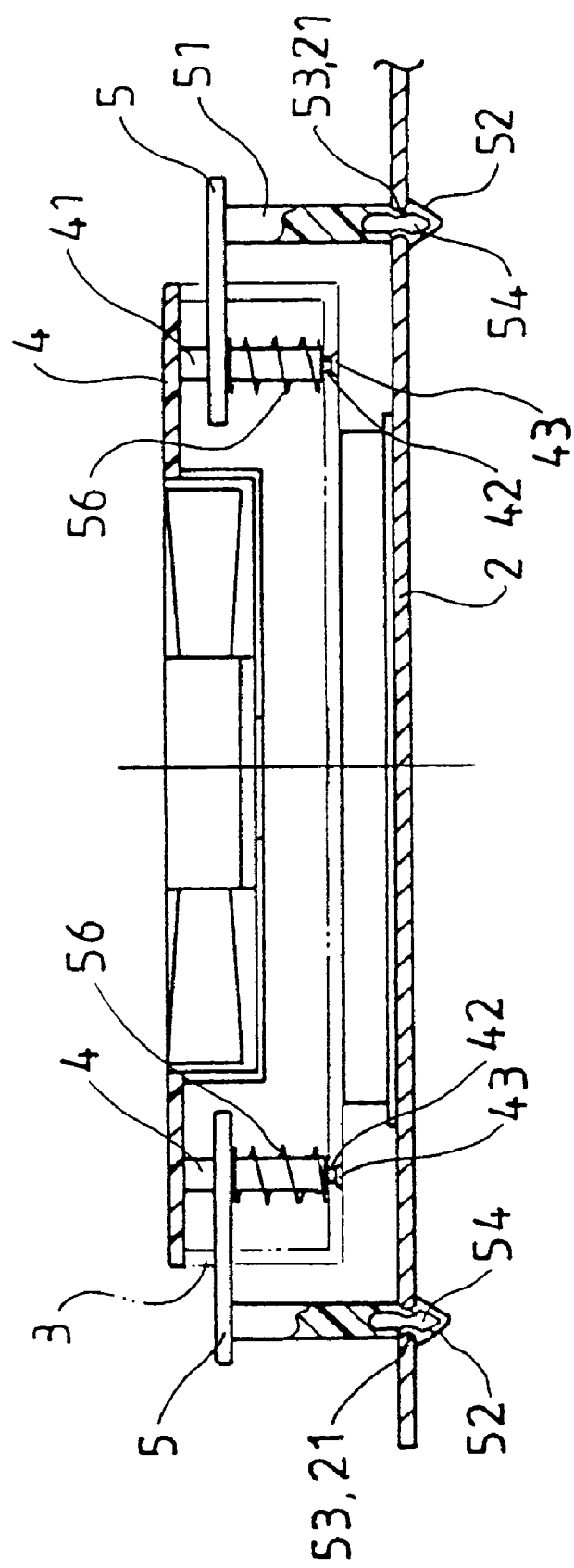
FIG. 4 is a sectional view of the positioning device in FIG. 3.

FIG. 4 is a sectional view illustrating assembly the second embodiment of the positioning device in accordance with the present invention. Each peg 41 of the cover plate 41 is extended through an associated hole 55 in the assembly plate 5 with an elastic element 56 sleeved around the peg 41. A fastener 43 (e.g., a screw) is extended through a corresponding hole (not labeled) in the object 3 and into the hole 42 of the peg 41 of the cover plate 4. The engaging portion 52 of each engaging post 51 is compressed and passed through the associated positioning hole 21 in the fixing plate 2. The annular shoulder 53 is retained to an underside (in an area surrounding the positioning hole 21) of the fixing plate 2 after the annular shoulder 53 has passed through the associated positioning hole 21. Thus, the cover plate 4 and the object 3 are secured to the fixing plate 2.

According to the above description, it is appreciated that the engaging post in accordance with the present invention allows easy and convenient assembly, detachment, and fixing. In addition, the transverse slot of the engaging post does not have an open end such that the engaging portion of the engaging post is less likely to have a resiliency fatigue or break from its root portion and thus disengaged from the positioning hole. As a result, the engaging post provides a reliable securing effect. Of more importance, the engaging post in accordance with the present invention is not limited to dissipating device. Instead, it can be formed on a first object and engaged with a positioning hole in a second object, thereby securing the two objects together.

Although the invention has been explained in relation to its preferred embodiment as mentioned above, it is to be understood that many other possible modifications and variations can be made without departing from the spirit and scope of the invention. It is, therefore, contemplated that the appended claims will cover such modifications and variations that fall within the true scope of the invention.

What is claimed is:

1. A positioning device for a heat-dissipating device, comprising:

a fixing plate including a plurality of positioning holes; and a cover plate including an underside with a plurality of pegs extended from the underside, each said peg including a distal end with an engaging hole;

a plurality of assembly plates each having a hole through which an associated said peg extends, each said assembly plate further includes an engaging post extended therefrom, each said engaging post including a conic distal end with an enlarged annular shoulder, each said engaging post including a transverse slot that extends over the annular shoulder;

whereby the annular shoulder is compressed and passed through an associated said positioning hole and then expands into its original shape so as to be retained to an underside of the fixing plate in an area surrounding the associated positioning hole.

2. The positioning device as claimed in claim 1, wherein each said engaging post includes an elastic element sleeved therearound.

3. The positioning device as claimed in claim 1, wherein each said peg has an elastic element sleeved therearound.

\* \* \* \* \*